US012755804B2

(12) United States Patent
Luo et al.

(10) Patent No.: US 12,755,804 B2
(45) Date of Patent: Oct. 6, 2026

(54) APPARATUSES AND METHODS FOR READ DATA PRECONDITIONING USING A NEURAL NETWORK

(71) Applicant: Micron Technology, Inc., Boise, ID (US)

(72) Inventors: Fa-Long Luo, San Jose, CA (US); Jaime Cummins, Bainbridge Island, WA (US)

(73) Assignee: Micron Technology, Inc., Boise, ID (US)

(*) Notice: Subject to any disclaimer, the term of this patent is extended or adjusted under 35 U.S.C. 154(b) by 94 days.

(21) Appl. No.: 18/650,444

(22) Filed: Apr. 30, 2024

(65) Prior Publication Data

US 2024/0379181 A1 Nov. 14, 2024

Related U.S. Application Data

(60) Provisional application No. 63/501,072, filed on May 9, 2023.

(51) Int. Cl.
*G11C 29/12* (2006.01)
*G11C 11/54* (2006.01)
*G11C 29/36* (2006.01)

(52) U.S. Cl.
CPC .......... *G11C 29/1201* (2013.01); *G11C 11/54* (2013.01); *G11C 29/36* (2013.01)

(58) Field of Classification Search
CPC ............................ G11C 29/1201; G11C 29/12
USPC .......................................................... 365/201
See application file for complete search history.

(56) References Cited

U.S. PATENT DOCUMENTS

| | | | | |
|---|---|---|---|---|
| 2003/0115037 | A1 | 6/2003 | Sumida | |
| 2018/0033470 | A1 | 2/2018 | Lee et al. | |
| 2019/0050159 | A1* | 2/2019 | Jung | G06F 3/0604 |
| 2020/0293415 | A1 | 9/2020 | Mukherjee et al. | |
| 2021/0326041 | A1 | 10/2021 | Kumar et al. | |
| 2022/0057962 | A1* | 2/2022 | Li | G06N 3/09 |
| 2022/0300197 | A1 | 9/2022 | Sethuraman et al. | |
| 2022/0399060 | A1* | 12/2022 | Lu | G11C 16/28 |

FOREIGN PATENT DOCUMENTS

| | | | |
|---|---|---|---|
| CN | 115171766 | A | 10/2022 |
| WO | 2024233211 | A1 | 11/2024 |

OTHER PUBLICATIONS

International Search Report & Written Opinion dated Aug. 2, 2024 for PCT Appl. No. PCT/US2024/027166; pp. all.
PCT Application No. PCT/US24/27166, titled "Apparatuses and Methods for Read Data Preconditioning Using a Neural Network" filed May 1, 2024, pp. all pages of application as filed.

* cited by examiner

*Primary Examiner* — Muna A Techane
(74) *Attorney, Agent, or Firm* — Dorsey & Whitney LLP

(57) ABSTRACT

A memory includes a read/write amplifier configured to retrieve read data from a memory array, and a neural network based preconditioning circuit configured to receive a read data signal according to the read data. A neural network of the preconditioning circuit is configured to precondition the read data signal based on a characteristic of a read data transmission path to provide a modified read data signal. The memory further includes an output driver configured to transmit the modified read data signal.

18 Claims, 6 Drawing Sheets

APPARATUSES AND METHODS FOR READ DATA PRECONDITIONING USING A NEURAL NETWORK

CROSS REFERENCE TO RELATED APPLICATION(S)

This application claims the benefit under 35 U.S.C. § 119 of the earlier filing date of U.S. Provisional Application Ser. No. 63/501,072 filed May 9, 2023, the entire contents of which are hereby incorporated by reference in their entirety for any purpose.

BACKGROUND

Digital systems, such as memory devices, continue to operate at higher and higher speeds. Various signal lines that carry digital signals may exhibit low-pass filter (LPF) characteristics, either due to increasing channel loss with frequency, or through capacitive filtering. In addition, process and temperature variance can also impact the speed at which circuitry is capable of operating. Thus, the maximum data rate supported by a channel becomes limited. Existing solutions to compensate for channel data rate limitations may include various equalization techniques, which include added complex circuitry that may not effectively improve channel data rate in many circumstances. One conventional approach to equalization includes modification of the signal line to make the signal line less capacitive, or modification of the signal to be less affected by capacitance, for example, by inserting repeaters or inverters on the signal line.

DETAILED DESCRIPTION

This disclosure describes examples of apparatuses and methods using a machine learning model trained based on channel characteristics of a semiconductor device to, during a read operation, precondition read data signals used to transmit read data. In some examples, the machine learning model may include a neural network. Preconditioning may include modifying the shape of a transmitted signal such that the properties (e.g., capacitance, circuit switching speed, etc.) of the signal line cause the transmitted signal to be received and stored at the memory cell array with a desired shape. Preconditioning may include pre-emphasis or de-emphasis of the signal shape. Pre-emphasis refers to increasing the amplitude of a digital signal by providing, at every bit transition, an overshoot that becomes filtered by the capacitive effects of the signal line. De-emphasis refers to a complementary process of decreasing the amplitude of a digital signal, where at every bit transition a full rail-to-rail swing between a high supply voltage (VDDQ, VDD) and low supply voltage (VSSQ, VSS) is provided.

One conventional way to implement de-emphasis/pre-emphasis is to utilize a delay chain to sequentially turn on or turn off the legs of a pull-up and/or pull-down circuit of a voltage driver. This causes a dynamic change in the driver output impedance, which can degrade signal integrity. Furthermore, de-emphasis/pre-emphasis is typically asymmetric, either strengthening pull-up from VSSQ or pull-down from VDDQ. The use of the trained machine learning model (e.g., such as a neural network) may mitigate the negative impacts of these conventional approaches.

The following detailed description illustrates a few exemplary embodiments in further detail to enable one of skill in the art to practice such embodiments. The described examples are provided for illustrative purposes and are not intended to limit the scope of the invention. In the following description, for the purposes of explanation, numerous specific details are set forth in order to provide a thorough understanding of the described embodiments. It will be apparent to one skilled in the art, however, that other embodiments of the present invention may be practiced without some of these specific details.

Figure 1:
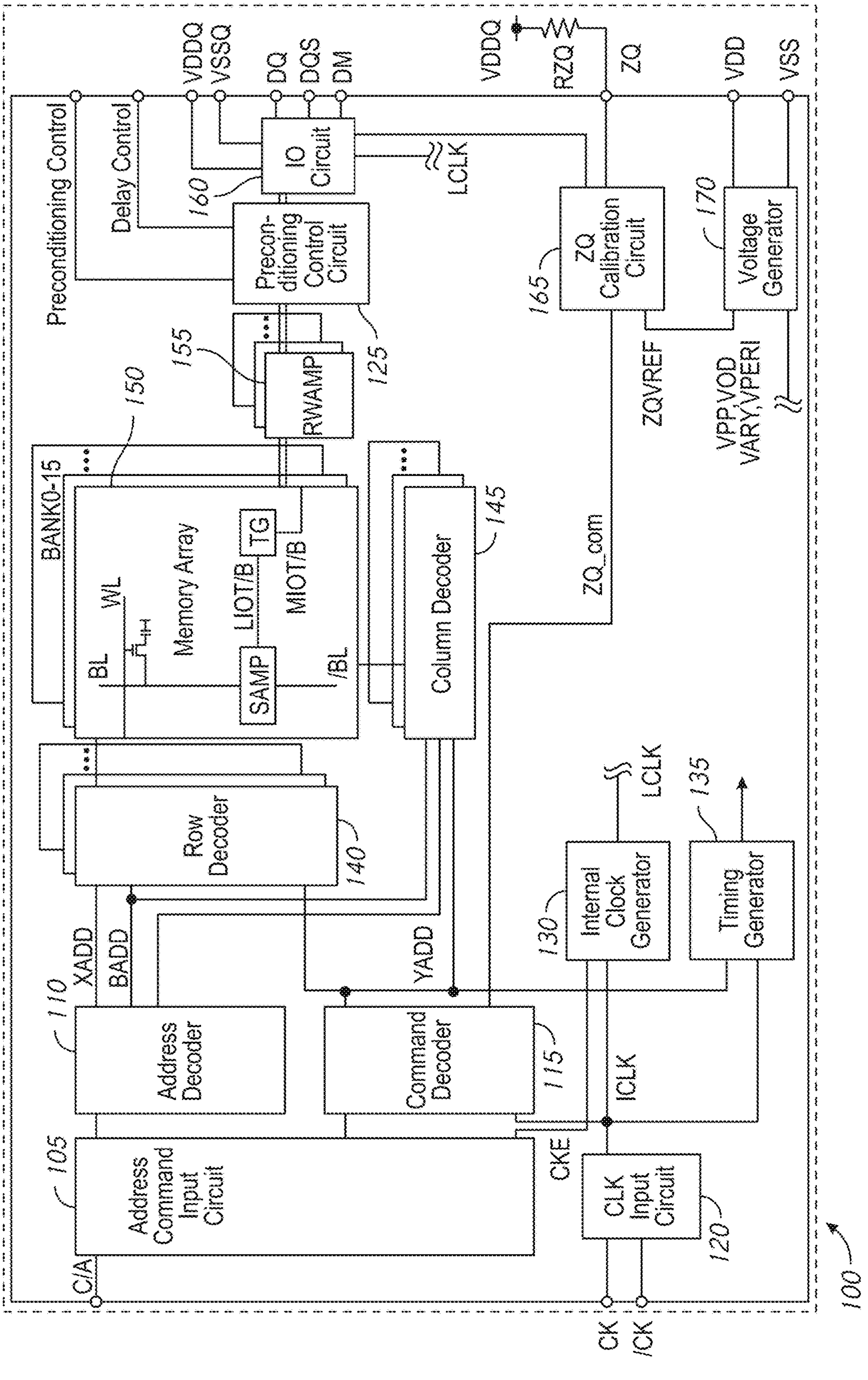
FIG. 1 is a schematic diagram of a semiconductor device, according to various embodiments.

FIG. 1 is a schematic diagram of a semiconductor device 100, according to various embodiments. The semiconductor device 100 includes a memory die. The memory die may include an address/command input circuit 105, address decoder 110, command decoder 115, clock input circuit 120, internal clock generator 130, timing generator 135, row decoder 140, column decoder 145, memory arrays 150, read/write amplifiers 155, a preconditioning control circuit 125, I/O circuit 160, ZQ calibration circuit 165, and voltage generator 170.

In some embodiments, the semiconductor device 100 may include, without limitation, a DRAM device, such as a DDR3 or DDR4 device integrated into a single semiconductor chip, for example. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SA) are located for their corresponding bit lines BL and connected to at least one respective local I/O line, which is in turn coupled to a respective one of at least two main I/O line pairs, via transfer gates (TG), which function as switches.

The semiconductor device 100 may employ a plurality of external terminals that include address and command terminals coupled to command/address bus (C/A), clock terminals CK and/CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the address/command input circuit 105, to an address decoder 110. The address decoder 110 receives the address signal and supplies a decoded row address signal to the row decoder 140, and a decoded column address signal to the column decoder 145. The address decoder 110 also receives the bank address signal and supplies the bank address signal to the row decoder 140, the column decoder 145.

The command/address terminals may further be supplied with a command signal from outside, such as, for example, a memory controller. The command signal may be provided, via the C/A bus, to the command decoder 115 via the address/command input circuit 105. The command decoder 115 decodes the command signal to generate various internal commands that include a row command signal to select a word line and a column command signal, such as a read command or a write command, to select a bit line.

Accordingly, when a read command is issued and a row address and a column address are timely supplied with the read command, read data is read from a memory cell in the memory array 150 designated by these row address and column address. The read data DQ is output to the outside from the data terminals DQ, DQS, and DM via read/write amplifiers 155 and an input/output circuit 160. Similarly, when the read command is issued and a row address and a column address are timely supplied with this command, and then read data is supplied to the data terminals DQ, DQS, DM, the read data is received by data receivers in the input/output circuit 160, and supplied via the input/output circuit 160 and the read/write amplifiers 155 to the memory array 150 and written in the memory cell designated by the row address and the column address.

When read data DQ is output from the memory array 150 by the read/write amplifiers 155, the data has not yet undergone preconditioning. Accordingly, the read data may be provided by the read/write amplifiers 155 to the preconditioning control circuit 125, and the preconditioning control circuit 125 may then precondition the read data DQ signal. The preconditioning may be controlled according to control signals, including a preconditioning control signal. When read data DQ is received at the read/write amplifiers 155, it would typically be passed onto the input/output circuit 160 to be transmitted externally over a data bus. However, to improve a channel data rate for transmitting the read data, the read data signals may be processed through a machine learning model (e.g., a neural network) of the preconditioning control circuit 125 trained based on a channel characteristics of a semiconductor device to modify the shape of the read data signals such that the properties (e.g., capacitance, circuit switching speed, etc.) of the read data channels cause the transmitted read data signals to be received at target device with a desired shape. The read data channel may include the output drivers of the input/output circuit 160 and/or the data bus transmission channel. Preconditioning may include pre-emphasis or de-emphasis of the signal shape.

The machine learning model implemented using a neural network may be trained to set coefficients that are applied to the read data signals to compensate for channel characteristics of the read data channels and corresponding circuitry. For example, using the following equation:

$$y_i(k) = x_i(k) + f_i(k)$$

where $y_i(k)$ is the real voltage at i'th cell and its k level (total K levels), $x_i(k)$ is the target voltage at i'th cell and its k level, and $f_i(k)$ is the shifted voltage incurred by programming noise, inter-cell interferences and leakage, etc. To train the neural network, cells in a code word $x_i(k)$ (i=1, . . . L) may be programmed, and then a real voltage $y_i(k)$ may be measured. Preconditioning control signals may be used during training to train the neural network by adjusting coefficients used by the neural network to modify the write data signals. During the training, the input to the neural network may be $y_i(k)$ (K×L) and the target output may be $x_i(k)$. The real voltage $y_i(k)$ may be compared against the target output $x_i(k)$. During the training, the input to the neural network may be $y_i(k)$ (K×L) to determine the converged difference estimation $f_i(k)$ (e.g., the target input $x_i(k)$ minus output of neural network equals to f; (k)). The coefficients may be modified until the target output $x_i(k)$ is met, and the converged difference and the coefficients may be stored in coefficient data memory. During a read operation, the neural network of the preconditioning control circuit 125 may receive the read data signals $x_i(k)$ from the memory array 150 and the neural network may modify the $x_i(k)$ using the stored coefficients to provide a new programming voltage for the read data signal (e.g., which should be $x_i(k)-f_i(k)$ or equals to that input of neural networks minus $f_i(k)$). Consequently, due to the channel characteristics after transmission of the read data signals to the drivers of the input/output circuit 160, the resulting voltage of the read data signals is $x_i(k)$.

Turning to the explanation of the external terminals included in the semiconductor device 100, the clock terminals CK and/CK are supplied with an external clock signal and a complementary external clock signal, respectively. The external clock signals (including complementary external clock signals) may be supplied to a clock input circuit 120. The clock input circuit 120 may receive the external clock signals to generate an internal clock signal ICLK. The internal clock signal ICLK is supplied to an internal clock generator 130 and thus a phase controlled internal clock signal LCLK is generated based on the received internal clock signal ICLK and a clock enable signal CKE from the address/command input circuit 105. Although not limited thereto, a DLL circuit can be used as the internal clock generator 130. The phase controlled internal clock signal LCLK is supplied to the input/output circuit 160 and is used as a timing signal for determining an output timing of read data. The internal clock signal ICLK is also supplied to a timing generator 135 and thus various internal clock signals can be generated.

The power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI, and the like and a reference potential ZQVREF based on the power supply potentials VDD and VSS. The internal potential VPP is mainly used in the row decoder 140, the internal potentials VOD and VARY are mainly used in the sense amplifiers included in the memory array 150, and the internal potential VPERI is used in many other circuit blocks. The reference potential ZQVREF is used in the ZQ calibration circuit 165.

The power supply terminals are also supplied with power supply potentials VDDQ and VSSQ. These power supply potentials VDDQ and VSSQ are supplied to the input/output circuit 160. The power supply potentials VDDQ and VSSQ are the same potentials as the power supply potentials VDD and VSS, respectively. However, the dedicated power supply potentials VDDQ and VSSQ are used for the input/ output circuit 160 so that power supply noise generated by the input/output circuit 160 does not propagate to the other circuit blocks.

The calibration terminal ZQ is connected to the ZQ calibration circuit 165. The ZQ calibration circuit 165 performs a calibration operation with reference to an impedance of RZQ, and the reference potential ZQVREF, when activated by the ZQ calibration command signal (ZQ_com). An impedance code ZQCODE obtained by the calibration operation is supplied to the input/output circuit 160, and thus an impedance of an output buffer (not shown) included in the input/output circuit 160 is specified.

Figure 2:
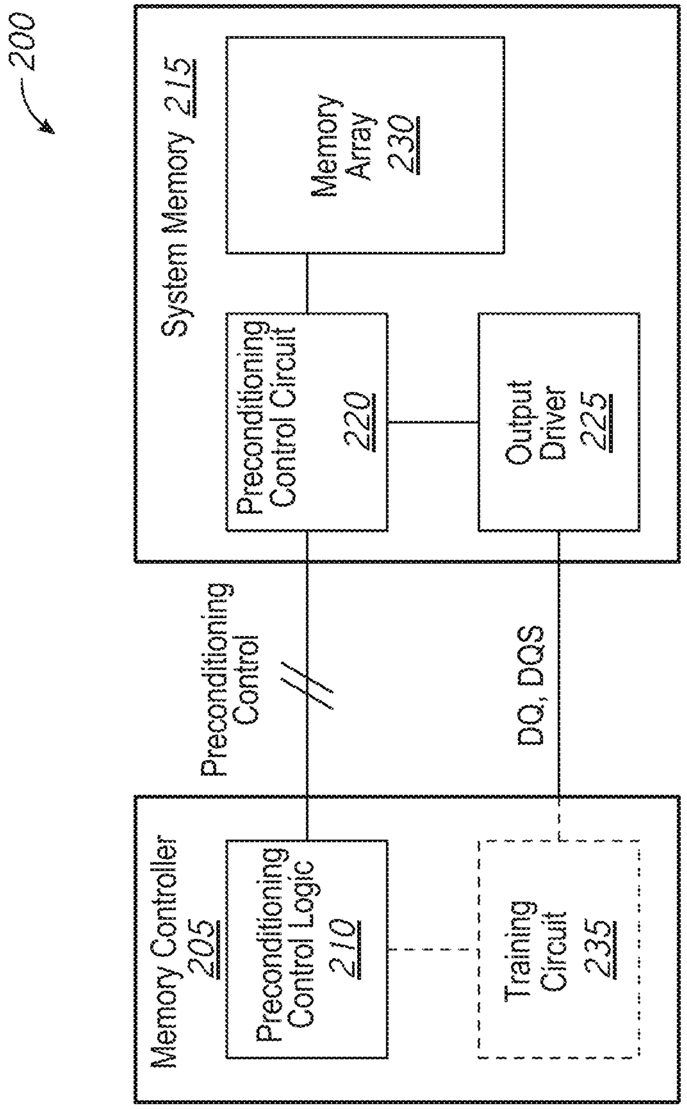
FIG. 2 illustrates a schematic block diagram of a system for preconditioning of read data signals in a memory device, in accordance with various embodiments.

FIG. 2 illustrates a schematic block diagram of a system 200 for preconditioning of read data signals in a memory device, in accordance with various embodiments. The system 200 may include a memory controller 205 coupled to system memory 215. The memory controller 205 may include preconditioning control logic 210. System memory 215 may include a preconditioning control circuit 220 that is configured to receive preconditioning controls signals from the preconditioning control logic 210. The preconditioning control circuit 220 may further be configured to receive data (DQ) from memory array 230. DQ may include digital data to be equalized by the preconditioning control circuit 220, before being output, via the output driver 225, externally, for example to the memory controller 205. The preconditioning control circuit 220 may be coupled to the output driver 225. In some embodiments, output driver 225 may include, without limitation, push-pull voltage drivers. The output driver 225 may in turn be configured to output an equalized digital signal to the memory controller 205.

In some examples, the preconditioning time for modifying the shape of the read data DQ may be controlled via external control signals, such as those generated by the preconditioning control logic 210. This may include adjustment of the preconditioning time, as well as the preconditioning amplitude adjustment magnitude. The memory controller 205 may include an external controller, such as a processor, to control preconditioning operations.

In some embodiments, memory controller 205 may optionally include a training circuit 235. The training circuit 235 may be configured to train a machine learning model (e.g., such as a neural network) of the preconditioning control circuit 220 to precondition the read data signals prior to provision to the output drivers 225, based on, without limitation, data eye optimization, reference voltage (amplitude) calibration, and read data training. In some embodiments, the training circuit 235 may also optionally be connected to the preconditioning control logic 210. Accordingly, in some embodiments, the preconditioning control signals may be adjusted to adjust the coefficients of the machine learning model based on input from the training circuit 235, such as, for example, in data eye optimization. In further embodiments, data eye optimization may include first identifying a preconditioning amplitude adjustment direction (e.g., de-emphasis or pre-emphasis) and magnitude providing the best data eye for a given channel, such as, without limitation, a data path for data out the output driver 225. To perform the training, cells in a code word may be programmed, and then a real voltage may be measured. During the training, the input to the machine learning model may be an expected output and the target output may be the read data signals. The training circuit 235 may compare the real voltage against the target output to determine the converged difference estimation (e.g., the target input minus output of the machine learning model). The training circuit 235 may modify the coefficients of the neural network until the target output is met, and the converged difference and the coefficients may be stored in coefficient data memory.

Figure 3:
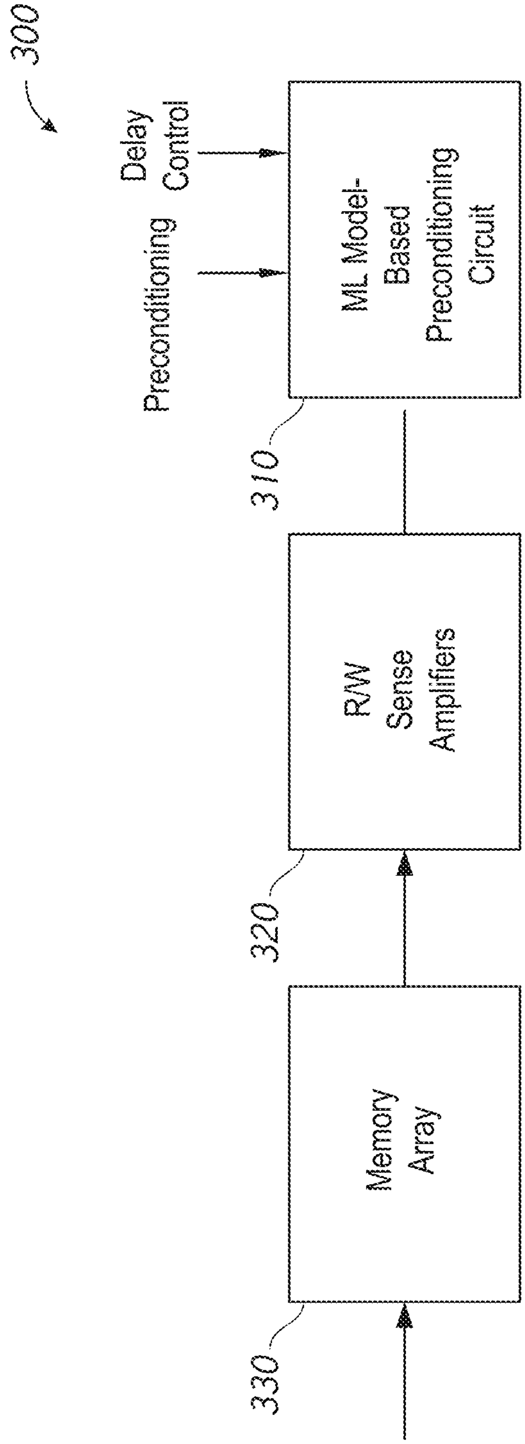
FIG. 3 illustrates a schematic block diagram of a neural network-based system for preconditioning of read data signals in a memory device, in accordance with various embodiments.

FIG. 3 illustrates a schematic block diagram of a system 300 for preconditioning of read data signals in a memory device, in accordance with various embodiments. The system 300 may include a machine learning model based preconditioning control circuit 310, read/write amplifiers 320, and a memory array 330. The memory array 330 may be configured to provide read data to the read/write amplifiers 320, which may in turn provide read data signals to the machine learning model based preconditioning control circuit 310. A machine learning model (e.g., such as a neural network) of the preconditioning control circuit 310 may be configured to precondition the read data signals using stored coefficients prior to providing the read data signals to an output driver (not shown).

In some examples, the preconditioning time for modifying the shape of the read data DQ may be controlled via external control signals. This may include adjustment of the preconditioning time, as well as the preconditioning amplitude adjustment by changing the coefficients applied to the read data signals by the machine learning model.

Figure 4:
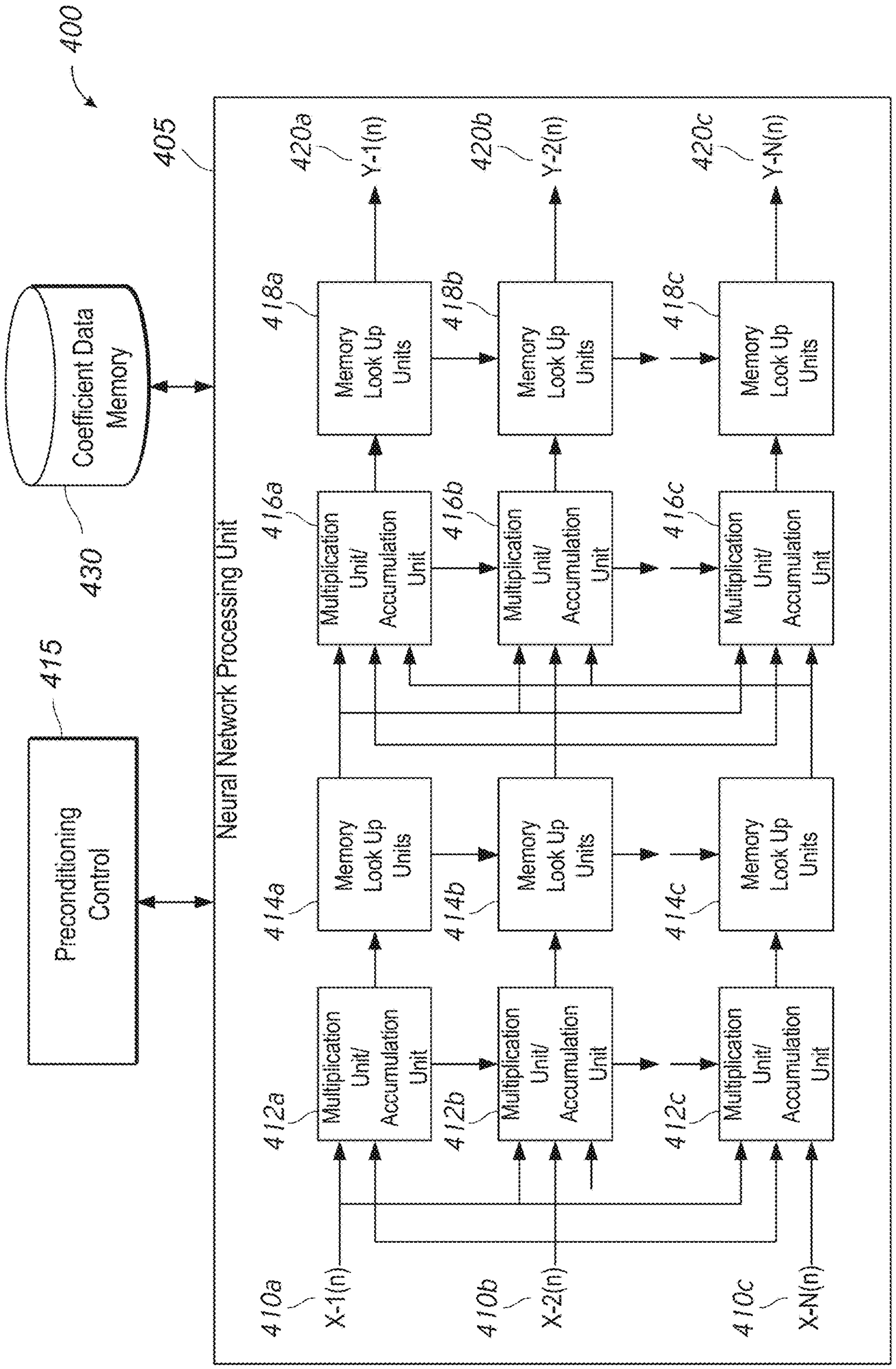
FIG. 4 is a block diagram that illustrates a processing unit arranged in a computing system, in accordance with various embodiments.

FIG. 4 is a block diagram that illustrates a processing unit 405 arranged in a computing system 400, in accordance with various embodiments. The system 400 may include the semiconductor device 100 of FIG. 1, the system 200 of FIG. 2, the system 300 of FIG. 3. The processing unit 405 can be configured to implement a neural network to implement a machine learning model, such as a neural network trained to precondition read data signals based on channel characteristics of a memory device.

The processing unit 405 may receive input data (e.g. X_1/2/N (n)) 410*a-c* from a computing system, such as a host computing device. In some examples, the input data 410*a-c* may be read data associated with read operations at a memory. The processing unit 405 may include multiplication unit/accumulation units 412*a-c*, 416*a-c* and memory lookup units 414*a-c*, 418*a-c* that, when mixed with coefficient data retrieved from the memory 430, may generate output data (e.g., Y_1/2/N (n)) 420*a-c*. In some examples, the output data 420*a-c* may be utilized as input data for another processing stage or as output data, such as one or more channel characteristics associated with the channel within the memory. In other words, the process unit 405 can include one or more stages of a neural network, such that the processing unit 405 receives input data 410*a-c* comprising data associated with read operations and generates output data 420*a-c* comprising one or more of the channels via which the read operations are performed 410*a-c*.

In implementing one or more processing units 405, a computer-readable medium at an electronic device may execute respective control instructions to perform operations through executable preconditioning control instructions 415 within a processing unit 405. For example, the control instructions provide instructions to the processing unit 405 that, when executed by the electronic device, cause the processing unit 405 to configure the multiplication units 412*a-c* to multiply input data 410*a-c* with coefficient data and accumulation units 416*a-c* to accumulate processing results to generate the output data 420*a-c*.

The multiplication units/accumulation units 412*a-c*, 416*a-c* multiply two operands from the input data 410*a-c* to generate a multiplication processing result that is accumulated by the accumulation unit portion of the multiplication units/accumulation units 412*a-c*, 416*a-c*. The multiplication units/accumulation units 412*a-c*, 416*a-c* add the multiplication processing result to update the processing result stored in the accumulation unit portion, thereby accumulating the multiplication processing result. For example, the multiplication unit/accumulation units 412*a-c*, 416*a-c* may perform a multiply-accumulate operation such that two operands, M and N, are multiplied and then added with P to generate a new version of P that is stored in its respective multiplication unit/accumulation units. The memory look-up units 414*a-c*, 418*a-c* retrieve coefficient data stored in memory 430. For example, the memory look-up unit can be a table look-up that retrieves a specific coefficient. The output of the memory look-up units 414*a-c*, 418*a-c* is provided to the multiplication unit/accumulation units 412*a-c*, 416*a-c* that may be utilized as a multiplication operand in the multiplication unit portion of the multiplication units/accumulation units 412*a-c*, 416*a-c*. Using such a circuitry arrangement, the output data (e.g., Y_1/2/N (n)) 420*a-c* may be generated from the input data (e.g., X_1/2/N (n) 410*a-c*.

In some examples, coefficient data, for example from memory 430, can be mixed with the input data X_1/2/N (n) 410*a-c* to generate the output data Y_1/2/N (n) 420*a-c*.

As described above, the memory look-up units 414*a-c*, 418*a-c* retrieve coefficients to mix with the input data. Accordingly, the output data may be provided by manipulating the input data with multiplication/accumulation units using a set of coefficients stored in the memory associated with characteristic of a read data channel at the memory. The resulting mapped data may be manipulated by additional multiplication/accumulation units using additional sets of coefficients stored in the memory associated with the characteristic of the channel. The sets of coefficients multiplied at each stage of the processing unit 405 may represent or provide an estimation of the processing of the input data in specifically-designed hardware (e.g., an FPGA). Further, it can be shown that the system 400 may approximate any nonlinear mapping with arbitrarily small error in some examples and the mapping of system 400 is determined by the coefficients. For example, if such coefficient data is specified, any mapping and processing between the input data X_1/2/N (n) 410*a-c* and the output data Y_1/2/N (n) 420*a-c* may be accomplished by the system 400. Such a relationship, as derived from the circuitry arrangement depicted in system 400, may be used to train an entity of the computing system 400 to generate coefficient data. For example, an entity of the computing system 400 may compare input data to the output data to generate the coefficient data.

In the example of system 400, the processing unit 405 mixes the coefficient data with the input data X_1/2/N (n) 410*a-c* utilizing the memory look-up units 414*a-c*, 418*a-c*. In some examples, the memory look-up units 414*a-c*, 418*a-c* can be referred to as table look-up units. The coefficient data may be associated with a mapping relationship for the input data X_1/2/N (n) 410*a-c* to the output data Y_1/2/N (n) 420*a-c*. For example, the coefficient data may represent non-linear mappings of the input data X_1/2/N (n) 410*a-c* to the output data Y_1/2/N (n) 420*a-c*. In some examples, the non-linear mappings of the coefficient data may represent a Gaussian function, a piecewise linear function, a sigmoid function, a thin-plate-spline function, a multi-quadratic function, a cubic approximation, an inverse multi-quadratic function, or combinations thereof. In some examples, some or all of the memory look-up units 414*a-c*, 418*a-c* may be deactivated. For example, one or more of the memory look-up units 414*a-c*, 418*a-c* may operate as a gain unit with the unity gain. In such a case, the instructions (e.g., executable instructions 415) may be executed to facilitate selection of a unity gain processing mode for some or all of the memory look-up units 414*a-c*, 418*a-c*.

Each of the multiplication unit/accumulation units 412*a-c*, 416*a-c* may include multiple multipliers, multiple accumulation units, or and/or multiple adders. Any one of the multiplication units/accumulation units 412*a-c*, 416*a-c* may be implemented using an arithmetic logic unit (ALU). In some examples, any one of the multiplication units/accumulation units 412*a-c*, 416*a-c* can include one multiplier and one adder that each perform, respectively, multiple multiplications and multiple additions. The input-output relationship of a multiplication/accumulation unit 412, 416 may be represented as:

$$B_{out} = \sum_{i=1}^{I} C_i * B_{in}(i) \qquad \text{(Equation 1)}$$

where "I" represents a number to perform the multiplications in that unit, $C_i$ the coefficients which may be accessed from a memory, such as memory 430, and $B_{in}(i)$ represents a factor from either the input data X_1/2/N (n) 410*a-c* or an output from multiplication units/accumulation units 412*a-c*, 416*a-c*. In an example, the output of a set of multiplication units/accumulation units, $B_{out}$, equals the sum of the coefficient data, $C_i$ multiplied by the output of another set of multiplication unit/accumulation units, $B_{in}(i)$. $B_{in}(i)$ may also be the input data such that the output of a set of multiplication unit/accumulation units, $B_{out}$, equals the sum of coefficient data, $C_i$ multiplied by input data.

Figure 5:
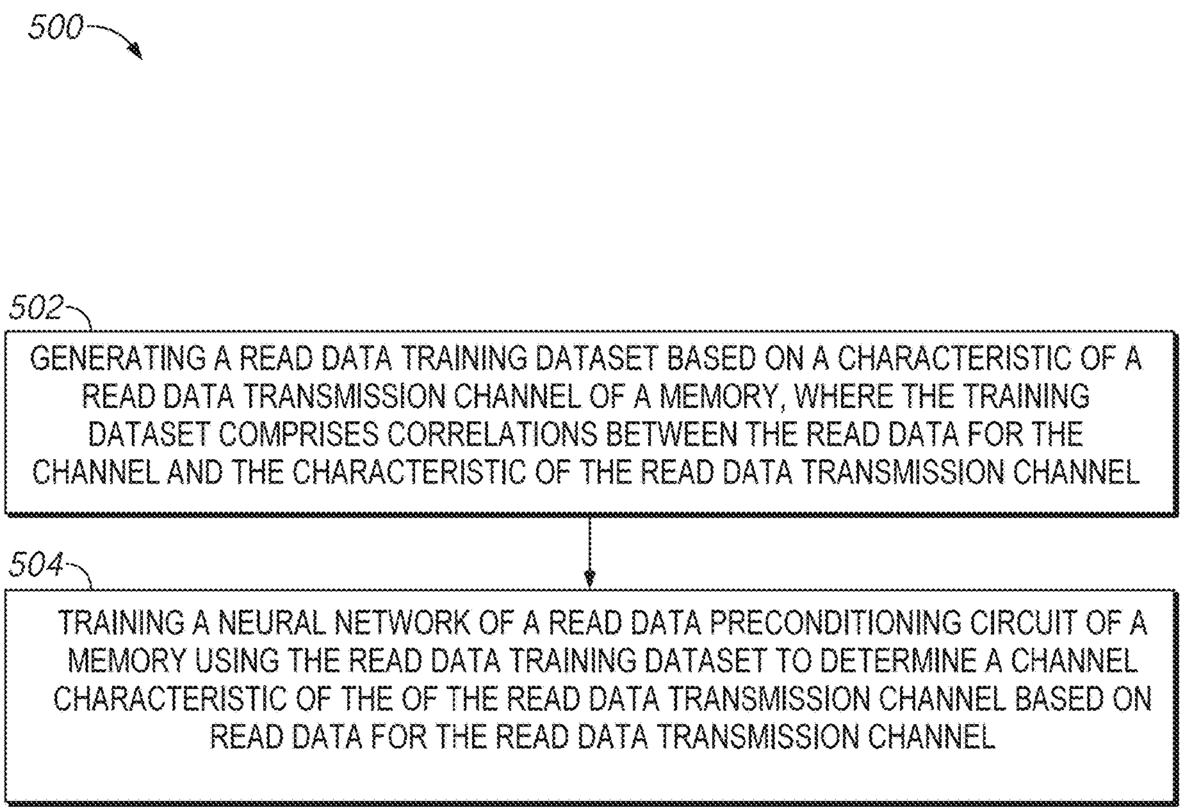
FIG. 5 is a flow diagram that illustrates a method for training a neural network to precondition read data signals at a memory, in accordance with various embodiments.

FIG. 5 is a flow diagram that illustrates a method 500 for training a machine learning model to precondition read data signals at a memory, in accordance with various embodiments. The method 500 can be performed, for example, using at least a portion of the semiconductor device 100 of FIG. 1 (e.g., the preconditioning control circuit 125) and/or the system 200 of FIG. 2 (e.g., the training circuit 235, the preconditioning control circuit 220, and/or the preconditioning control logic 210), the machine learning model based preconditioning circuit 310 of FIG. 3, and/or the processing unit 405 of FIG. 4.

The method 500 includes generating a read data training dataset based on a characteristic of a read data transmission channel of a memory, wherein the training dataset comprises correlations between the read data for the channel and the characteristic of the read data transmission channel, at 502.

The method 500 further includes training a machine learning model of a read data preconditioning circuit of a memory using the read data training dataset to determine a channel characteristic of the read data transmission channel based on read data for the read data transmission channel, at 504. In some examples, the read data training dataset is associated with a codeword of the memory. In some examples, the method 500 further includes applying the trained machine learning model to determine the characteristic of the read data transmission channel based on the read data, and modifying one or more coefficient values of the machine learning model associated with the read data channel based on the determined channel characteristic.

In some examples, the method 500 further includes generating write data training dataset using the read data, testing the trained neural network using the read data training dataset, and retraining the trained machine learning model using a different training dataset when the trained machine learning model does not exceed a threshold accuracy level.

Figure 6:
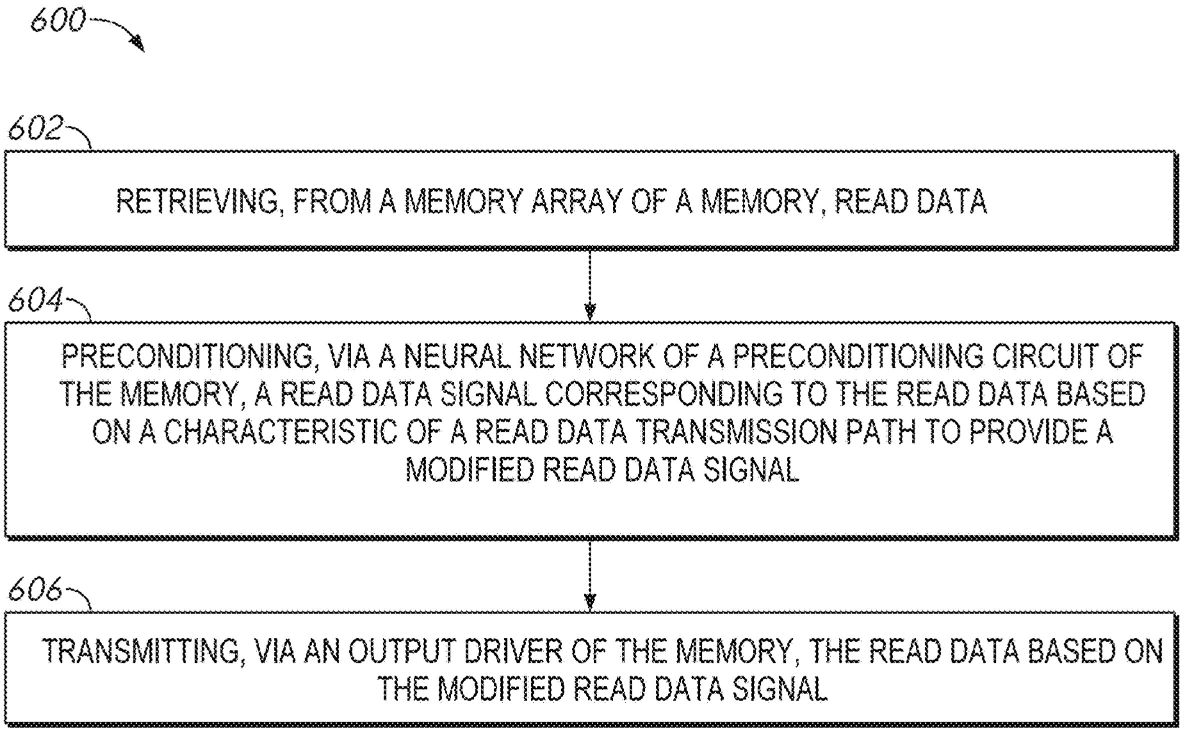
FIG. 6 is a flow diagram that illustrates a method for preconditioning read data signals at a memory using a neural network, in accordance with various embodiments.

FIG. 6 is a flow diagram that illustrates a method 600 for preconditioning read data signals at a memory using a machine learning model, in accordance with various embodiments. The method 500 can be performed, for example, using at least a portion of the semiconductor device 100 of FIG. 1 (e.g., the preconditioning control circuit 125) and/or the system 200 of FIG. 2 (e.g., the preconditioning control circuit 220 and/or the preconditioning control logic 210), the machine learning model based preconditioning circuit 310 of FIG. 3, and/or the processing unit 405 of FIG. 4. In some examples, the machine learning model may include a neural network.

The method 600 includes retrieving, from a memory array of a memory, read data, at 602.

The method 600 further includes preconditioning, via a machine learning model of a preconditioning circuit of the memory, a read data signal corresponding to the read data based on a characteristic of a read data transmission path to provide a modified read data signal, at 604. In some examples, the method 600 further includes modifying the read data signal based on one or more coefficient values selected based on the characteristic of the read data transmission path. In some examples, the method 600 may further include determining the one or more coefficient values during training of the machine learning model by writing test write data to the memory array and reading back the test write data. In some examples, the method 600 further includes causing, via the machine learning model, an amplitude of the read data signal to be increased and amplitude of the read data signal to provide the modified read data signal. In some examples, the method 600 further includes causing, via the machine learning model, an amplitude of the read data signal to be decreased to provide the modified read data signal. In some examples, the characteristic of the read data transmission path includes a capacitance of signal lines of the read data transmission path, process variation of circuit components of the memory array, or any combination thereof.

The method 600 further includes transmitting, via an output driver of the memory, the read data based on the modified read data signal, at 606.

While certain features and aspects have been described with respect to exemplary embodiments, one skilled in the art will recognize that various modifications and additions can be made to the embodiments discussed without departing from the scope of the invention. Although the embodiments described above refer to particular features, the scope of this invention also includes embodiments having different combinations of features and embodiments that do not include all of the above described features. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, various procedures may be reordered, added, and/or omitted in accordance with various embodiments. The procedures described with respect to one method or process may be incorporated within other described methods or processes; likewise, hardware components described according to a particular structural architecture and/or with respect to one system may be organized in alternative structural architectures and/or incorporated within other described systems. Hence, while various embodiments are described with or without certain features for ease of description, the various components and/or features described herein with respect to a particular embodiment can be combined, substituted, added, and/or subtracted from among other described embodiments. Consequently, although several exemplary embodiments are described above, it will be appreciated that the invention is intended to cover all modifications and equivalents within the scope of the following claims.

What is claimed is:

1. An apparatus comprising:

a read/write amplifier configured to retrieve read data from a memory array;

a preconditioning circuit configured to receive a read data signal based on the read data, wherein a machine learning model of the preconditioning circuit trained based on a characteristic of a read data transmission path is configured to precondition the read data signal based on the characteristic of the read data transmission path to provide a modified read data signal; and an output driver configured to transmit the modified read data signal, wherein the machine learning model includes a neural network configured to modify the read data signal based on one or more coefficient values selected based on the characteristic of the read data transmission path.

2. The apparatus of claim 1, wherein the one or more coefficient values are determined during training of the neural network by writing test write data to the memory array and reading the test write data back out.

3. The apparatus of claim 1, wherein the neural network includes multiplication and accumulation units configured to combine the read data signal and the one or more coefficient values.

4. The apparatus of claim 1, wherein the characteristic of the read data transmission path includes a capacitance of signal lines of the read data transmission path.

5. An apparatus comprising:

a read/write amplifier configured to retrieve read data from a memory array;

a preconditioning circuit configured to receive a read data signal based on the read data, wherein a machine learning model of the preconditioning circuit trained based on a characteristic of a read data transmission path is configured to precondition the read data signal based on the characteristic of the read data transmission path to provide a modified read data signal; and an output driver configured to transmit the modified read data signal, wherein the machine learning model is configured to cause an amplitude the read data signal to be adjusted to provide the modified read data signal.

6. An apparatus of comprising:

a read/write amplifier configured to retrieve read data from a memory array;

a preconditioning circuit configured to receive a read data signal based on the read data, wherein a machine learning model of the preconditioning circuit trained based on a characteristic of a read data transmission path is configured to precondition the read data signal based on the characteristic of the read data transmission path to provide a modified read data signal; and an output driver configured to transmit the modified read data signal, wherein the machine learning model is configured to cause an amplitude the read data signal to be increased to provide the modified read data signal.

7. An apparatus of comprising:

a read/write amplifier configured to retrieve read data from a memory array;

a preconditioning circuit configured to receive a read data signal based on the read data, wherein a machine learning model of the preconditioning circuit trained based on a characteristic of a read data transmission path is configured to precondition the read data signal based on the characteristic of the read data transmission path to provide a modified read data signal; and an output driver configured to transmit the modified read data signal, wherein the machine learning model is configured to cause an amplitude the read data signal be decreased to provide the modified read data signal.

8. An apparatus comprising:

a read/write amplifier configured to retrieve read data from a memory array;

a preconditioning circuit configured to receive a read data signal based on the read data, wherein a machine learning model of the preconditioning circuit trained based on a characteristic of a read data transmission path is configured to precondition the read data signal based on the characteristic of the read data transmission path to provide a modified read data signal; and an output driver configured to transmit the modified read data signal, wherein the characteristic of the read data path includes process variation of circuit components of the output driver.

9. A method, comprising:

generating a read data training dataset based on a characteristic of a read data transmission channel of a memory, wherein the training dataset comprises correlations between the read data for the channel and the characteristic of the read data transmission channel; and training a machine learning model of a read data preconditioning circuit of a memory using the read data training dataset to determine a channel characteristic of the of the read data transmission channel based on read data for the read data transmission channel.

10. The method of claim 9, wherein the read data training dataset is associated with a codeword of the memory.

11. The method of claim 9, further comprising:

applying the trained machine learning model to determine the characteristic of the read data transmission channel based on the read data; and modifying one or more coefficient values of the machine learning model associated with the read data channel based on the determined channel characteristic.

12. The method of claim 9, further comprising:

generating read data training dataset using the read data;

testing the trained machine learning model using the read data training dataset; and retraining the trained machine learning model using a different training dataset when the trained neural network does not exceed a threshold accuracy level.

13. A method comprising:

retrieving, from a memory array of a memory, read data;

preconditioning, via a machine learning model of a preconditioning circuit of the memory trained based on a characteristic of a read data transmission path, a read data signal corresponding to the read data based on the characteristic of the read data transmission path to provide a modified read data signal;

transmitting, via an output driver of the memory, the read data based on the modified read data signal; and modifying the read data signal based on one or more coefficient values selected based on the characteristic of the read data transmission path.

14. The method of claim 13, further comprising determining the one or more coefficient values during training of the machine learning model by writing test write data to the memory array and reading back the test write data.

15. The method of claim 13, wherein the characteristic of the read data transmission path includes a capacitance of signal lines of the read data transmission path.

16. A method comprising:

retrieving, from a memory array of a memory, read data;

preconditioning, via a machine learning model of a preconditioning circuit of the memory trained based on a characteristic of a read data transmission path, a read data signal corresponding to the read data based on the characteristic of the read data transmission path to provide a modified read data signal;

transmitting, via an output driver of the memory, the read data based on the modified read data signal; and causing, via the machine learning model, an amplitude of the read data signal to be increased to provide the modified read data signal.

17. A method comprising:

retrieving, from a memory array of a memory, read data;

preconditioning, via a machine learning model of a preconditioning circuit of the memory trained based on a characteristic of a read data transmission path, a read data signal corresponding to the read data based on the characteristic of the read data transmission path to provide a modified read data signal;

transmitting, via an output driver of the memory the read data based on the modified read data signal; and causing, via the machine learning model, an amplitude of the read data signal to be decreased to provide the modified read data signal.

18. A method of comprising:

retrieving, from a memory array of a memory, read data;

preconditioning, via a machine learning model of a preconditioning circuit of the memory trained based on a characteristic of a read data transmission path, a read data signal corresponding to the read data based on the characteristic of the read data transmission path to provide a modified read data signal; and transmitting, via an output driver of the memory, the read data based on the modified read data signal, wherein the characteristic of the read data transmission path includes process variation of circuit components of the memory array.

* * * * *